(12) United States Patent
Xu

(10) Patent No.: US 10,023,496 B1
(45) Date of Patent: Jul. 17, 2018

(54) NO FIBER CALCINATION OF GYPSUM FOR GYPSUM FIBERBOARD

(71) Applicant: United States Gypsum Company, Chicago, IL (US)

(72) Inventor: Yufeng Xu, Gurnee, IL (US)

(73) Assignee: UNITED STATES GYPSUM COMPANY, Chicago, IL (US)

( * ) Notice: Subject to any disclaimer, the term of this patent is extended or adjusted under 35 U.S.C. 154(b) by 0 days.

(21) Appl. No.: 15/625,343

(22) Filed: Jun. 16, 2017

(51) Int. Cl.
| | | |
|---|---|---|
| *C01F 11/46* | (2006.01) | |
| *C04B 11/00* | (2006.01) | |
| *C04B 11/032* | (2006.01) | |
| *C30B 29/46* | (2006.01) | |

(52) U.S. Cl.
CPC .......... *C04B 11/032* (2013.01); *C01F 11/466* (2013.01); *C30B 29/46* (2013.01); *C01P 2004/61* (2013.01)

(58) Field of Classification Search
CPC ........ C04B 11/032; C04B 11/00; C01F 11/46; C01F 11/466
See application file for complete search history.

(56) References Cited

U.S. PATENT DOCUMENTS

| | | | |
|---|---|---|---|
| 3,236,509 A | 2/1966 | Blair | |
| 3,337,298 A | 8/1967 | Ruter et al. | |
| 3,437,330 A * | 4/1969 | Worner | C01F 11/466 |
| | | | 106/783 |
| 3,576,599 A | 4/1971 | Anderson et al. | |
| 5,320,677 A | 6/1994 | Baig | |
| 7,815,889 B2 | 10/2010 | Luan et al. | |
| 7,918,950 B2 | 4/2011 | Skinner et al. | |
| 8,529,863 B2 | 9/2013 | Yokoyama et al. | |
| 2005/0161853 A1 | 7/2005 | Miller et al. | |
| 2016/0122197 A1 * | 5/2016 | Wu | C01F 11/466 |
| | | | 423/555 |

FOREIGN PATENT DOCUMENTS

| | | | | |
|---|---|---|---|---|
| EP | 0 672 634 A2 * | 9/1995 | ............. | C04B 11/02 |
| EP | 2418184 A2 | 2/2012 | | |
| GB | 992468 A | 5/1965 | | |
| GB | 1 027 434 A * | 4/1966 | ............. | C01F 11/46 |
| GB | 1243092 A | 8/1971 | | |
| WO | 9011256 A1 | 10/1990 | | |
| WO | WO 2009/135687 A1 * | 11/2009 | ............. | C04B 11/26 |

OTHER PUBLICATIONS

Machine Translation for EP0672634 A2, published Sep. 20, 1995, Applicant: Salzgitter Anlagenbau.

* cited by examiner

*Primary Examiner* — Timothy C Vanoy
(74) *Attorney, Agent, or Firm* — Vorys, Sater, Seymour and Pease LLP; Pradip Sahu; Philip T. Petti

(57) ABSTRACT

The present disclosure relates to no fiber calcined gypsum and methods of making the same using a multi-stage (typically two-stage) calcination process. The first stage is a high temperature calcination and nucleation stage. The second stage is a lower temperature calcination and crystal growth stage which produces product slurry containing calcined gypsum particles having large, acicular calcined gypsum crystal morphology for use in making gypsum fiberboard.

18 Claims, 10 Drawing Sheets

NO FIBER CALCINATION OF GYPSUM FOR GYPSUM FIBERBOARD

FIELD OF THE INVENTION

The present disclosure relates to an energy efficient method for producing calcined acicular alpha gypsum for the manufacturing of gypsum fiberboard. More particularly, the method employs a fiber-free, multi-stage (typically two-stage) calcination process characterized by a first seeding stage in which a certain amount of crystal nucleation is initiated, followed by a second crystal growth stage to achieve large, acicular alpha gypsum crystal morphology. The fiber-free, two-stage calcination process results in significant energy and cost savings.

BACKGROUND OF ART

Various properties of gypsum are beneficially desirable for making certain building and plaster products, such as gypsum fiberboard. Gypsum is a plentiful and generally inexpensive raw material which, through a process of dehydration and rehydration, can be cast, molded, or otherwise formed into useful shapes. Gypsum is further noncombustible and relatively stable when exposed to moisture.

Typically, gypsum fiberboard is prepared from slurries of alpha calcium sulfate hemihydrate (also known herein as, calcined alpha hemihydrate stucco, calcined gypsum, alpha hemihydrate stucco, hemihydrate gypsum, or calcined stucco) and cellulose fiber with an excess of water. For manufacturing gypsum fiberboard, the slurry is deposited onto a moving wire to remove water to form a mat and the formed mat is pressed to form to achieve the desired thickness and surface smoothness. During the manufacturing process, the calcined gypsum rehydrates such that the formed and pressed mat hardens. Such gypsum fiberboard is used largely for roofing board, interior wall, partition wall, and ceiling applications.

According to a process described in U.S. Pat. No. 5,320,677 to Baig, which is incorporated herein by reference in its entirety, a composite gypsum/wood fiber (GWF) material product and a process for forming the product is disclosed. In Baig, a dilute slurry of gypsum particles and cellulosic fibers are heated under pressure to convert the raw gypsum to calcium sulfate hemihydrate by calcining the gypsum in the presence of wood fibers. The dissolved calcium sulfate wets the voids in the fiber and the resulting hemihydrate eventually forms crystals in situ in the voids of the cellulose fiber. The process of Baig describes a single-stage process of producing the GWF material single stage calcination of both the gypsum particles and the cellulosic fibers. To form GWF wallboard, the calcined slurry is substantially dewatered before rehydrating the alpha hemihydrate stucco back to gypsum. Baig's single-stage process involves calcination of both gypsum and cellulosic fiber simultaneously.

U.S. Pat. No. 8,529,863 to Yokoyama et al. discloses a process for the continuous modification of dihydrate gypsum. Yokoyama discloses a step of calcining dihydrate gypsum into hemihydrate gypsum and a recrystallization step of hydrating and recrystallizing the hemihydrate gypsum in an aqueous slurry to convert it into modified dihydrate gypsum of a different crystalline form. The temperature during recrystallization is between, but not including 80° C. and 90° C. Yokoyama discloses both dry calcination and wet calcination, and a multistage processing of each step using multiple tanks. Yokoyama thus discloses a two-stage process in which the first stage converts gypsum dihydrate into hemihydrate gypsum, and the second stage converts hemihydrate gypsum to dihydrate gypsum. Yokoyama does not disclose a two-stage process in which both stages are characterized by the conversion of dihydrate gypsum into hemihydrate gypsum.

U.S. Pat. No. 7,815,889 to Luan et al., which is incorporated herein by reference in its entirety, discloses a method for calcining gypsum in a pressurized reactor by injecting combustion gasses and air into the reactor to create a fluidized bed of gypsum. The fluidized bed is heated to form calcined hemihydrate. Luan distinguishes its continuous process for calcining lower water demand hemihydrate from a batch process. In an example, gypsum is injected into a pressurized reactor; heated air, steam, and a portion of a combustion gas are injected to create a fluidized bed of gypsum; and the reactor is heated and maintained at a temperature of about 121° C. to about 149° C. (or about 250° F. to about 300° F.) and pressurized to a vapor pressure of 1.01×105 to 3.85×105 Pascal (Pa) (or from 1.0 to 3.8 atmospheres (atm)). Accordingly, the Luan method does not disclose a two-stage calcination process.

U.S. Pat. No. 3,236,509 to Blair discloses a dry calcination, single chamber process for continuous calcining of powdered gypsum rock. Powdered gypsum is fed into a chamber for calcination, followed by addition of new powdered gypsum feed at a temperature of 280° F. to 340° F. (138 to 171° C.). Blair thus discloses a dry calcination process, not a wet calcination process, and at identical temperature ranges throughout the process.

U.S. Pat. No. 3,579,599 to Anderson et al. discloses a continuous process for the production of calcium sulfate alpha-hemihydrate from gypsum. Anderson describes continuously passing a slurry of gypsum and water at superatmospheric pressure between about 4 and 10 atm into and through a reactor, maintaining the slurry in the reactor, and injecting steam at a pressure above the reactor pressure and a temperature greater than 100° C. to convert the gypsum into calcium sulphate alpha-hemihydrate. The method controls the steam injection by providing at least one hot zone of a temperature of at least 10° C. hotter than the mean slurry temperature to control crystal nucleation. Accordingly, the Anderson continuous process is performed as a single-stage process, and not a two-stage process.

EP 2418184 to Aschern discloses mixing gypsum-containing waste materials, flue-gas desulfurization gypsum, and water to obtain an aqueous suspension, which is heated to react the components and separate alpha calcium sulfate hemihydrate. The heating temperature is in the range of 105° C. to 150° C. Accordingly, Aschern discloses a single-phase process, not a two-stage process, at a single temperature range.

U.S. Pat. No. 3,437,330 to Worner discloses a process of continuous production of alpha plaster using a wet gypsum slurry feed to produce a dry, high strength plaster by regulation of temperature and pressure. In an example, a slurry of gypsum particulate and water is fed at a controlled rate into a pressurized chamber with steam and water at a temperature between 110° C. and 125° C. and maintained therein to convert the gypsum to fine crystals of alpha hemihydrate. The reacted slurry is transferred to another chamber at a higher pressure and temperature not to exceed 180° C. and maintained therein to grow the alpha hemihydrate crystals. Thus, Worner discloses a two-stage process, where the second stage is characterized by a temperature and pressure greater than the first stage.

U.S. Pat. No. 3,337,298 to Rüter et al. discloses a process for producing alpha calcium sulfate semi-hydrate from synthetic gypsum. The process can be performed in an autoclave in which an aqueous suspension of dehydrated calcium sulfate and crystallization agents are treated at temperatures between 105° C. and 140° C., with or without pressure, to influence crystallization. Salt solutions can be used to influence crystallization at a temperature close to the boiling point of the solution, such as in the range of 90° C. to 110° C. The pH of the aqueous suspension is maintained between 1 and 5. GB 992468 and GB 1243092 to the same applicant disclose similar processes. In GB 992468, after seed crystals of calcium sulphate α-hemihydrate are formed, an aqueous suspension of synthetic calcium sulphate dihydrate is added continuously or intermittently at the temperature and pH ranges of Rüter to convert the calcium sulphate dihydrate to crystalline calcium sulphate α-hemihydrate. In GB 1243092, crystal size and growth of calcium sulphate α-hemihydrate from calcium sulphate dihydrate is regulated by the continuous or intermittent addition of seed crystals of α-hemihydrate or β-hemihydrate at the temperature range of Rüter and a pH range of 1.1 to 5. Accordingly, pH ranges above 5 are not disclosed, an identical temperature range is applicable across all processing steps, and crystalline influencing agents are required.

EP 672634 to Brosig et al. discloses production of α-$CaSO_4$ semihydrate by continuous addition of a fine $CaSO_4$ dihydrate and water suspension into a stirred autoclave subjected to vapour pressure. Brosig discloses partial conversion of α-$CaSO_4$ semihydrate occurs by the pressurized wet process and residual conversion is completed in a second dry process by an autoclave subjected to vapour pressure and at temperatures exceeding 160° C. Thus, this is a single stage calcination process and no additional dihydrate is added to the second dry process for residual conversion. In addition, the second drying stage requires a drying temperature of at least 125° C., higher than the 100° C. temperature required in the present disclosure.

WO 1990/011256 to Lynn et al., incorporated herein in its entirety, discloses a process and apparatus for producing large diameter, high aspect ratio calcium sulfate microfibers. The process passes a steam heated dilute aqueous slurry having about 0.5% to 15% gypsum by weight through a pressure pump at a temperature of about 285° F. (141° C.). Laminar flow is established and the gypsum is converted to calcium sulfate alpha hemihydrate nucleates forming needle-like seed crystals. Thereafter, the crystals and unreacted gypsum is passed to a higher volume reactor and agitated, promoting radial and axial growth. Accordingly, Lynn discloses a two-stage calcination process, but with minimal gypsum loading (i.e., about 0.5-15 weight %) and at a set temperature throughout the process.

It will be appreciated that this background description has been created by the inventors to aid the reader and is not to be taken as an indication that any of the indicated problems were themselves appreciated in the art. While the described principles can, in some aspects and examples, alleviate the problems inherent in other systems, it will be appreciated that the scope of the protected innovation is defined by the attached claims and not by the ability of any disclosed feature to solve any specific problem noted herein. Thus, there is a continuing need for new and improved set gypsum-containing products and compositions used in preparing the products, particularly set accelerators, as well as methods for producing them, that solve, avoid, or minimize a problem noted above, and/or improves properties of the products.

SUMMARY OF THE INVENTION

The present disclosure provides a method including the following steps: performing a first calcination stage comprising heating a first gypsum slurry comprising a first portion of gypsum (calcium sulfate dihydrate) and a first aqueous fluid to a first temperature in a range of about 270° F. to about 295° F. (132 to 146° C.) and under pressure for a sufficient time to convert at least a portion of the first portion of gypsum to a first portion of calcium sulfate hemihydrate and nucleate at least a portion of the first portion of calcium sulfate hemihydrate to form nucleated acicular crystals of calcium sulfate hemihydrate of a first size, thereby producing a first calcination stage calcined gypsum product slurry having the nucleated acicular crystals of the first size; combining together or separately in any order a second portion of gypsum and second aqueous fluid with the first calcination stage calcined gypsum product slurry to form a combined gypsum slurry; and performing a second calcination stage comprising maintaining the combined gypsum slurry under pressure at a second temperature in the range of about 210° F. to about 240° F. (99 to 116° C.) for a sufficient time to form large acicular crystals of calcium sulfate hemihydrate of a second size greater than the first size, thereby forming a calcined gypsum slurry product. Preferably combining the second portion of gypsum and the second aqueous fluid are added as a second aqueous gypsum slurry to the first calcination stage calcined gypsum product slurry to form the combined gypsum slurry. A final added gypsum amount is a total weight of the first portion of gypsum and the second portion of gypsum. A total feed weight is a total weight of the first portion of gypsum, the second portion of gypsum, the first aqueous fluid, and the second aqueous fluid. The final added gypsum amount is equal to no greater than about 50% of the total feed weight. The first portion of gypsum is about 10% to about 50% by weight of the final added gypsum amount.

One aspect of the present disclosure relates to obtaining large, acicular calcined gypsum crystals at high solid gypsum dihydrate loading content by weight of an aqueous gypsum slurry, without the presence of host particles during calcination. By excluding the host particles, without reducing the gypsum dihydrate loading content, significant production energy and costs savings are beneficially realized.

The large, acicular calcined gypsum (calcium sulfate hemihydrate) crystals are obtained in accordance with the present disclosure employs a multi-stage calcination process, in which nucleation and crystal growth are controlled by means of loading content, temperature, and pH rather than inclusion of host particles, such as paper fibers. This multi-stage calcination process has at least two calcination stages. In particular, the first stage of the two-stage calcination process is a nucleation stage in which a desired amount of crystal nucleation is achieved; the second stage is a crystal growth stage in which the desired large, acicular crystal morphology is achieved. Crystal morphology is controlled by the amounts of gypsum dihydrate used in each stage. Ideally sized acicular calcined gypsum crystal morphology is desirable because it affects the speed of water removal and speed of calcined gypsum setting. For at least these reasons, such morphology is also desirable for use in forming gypsum fiberboard products.

The two-stage calcination process of the present disclosure further includes tiered temperature adjustment to facilitate the nucleation and crystal growth stages. For example, in the first nucleation stage a portion of the total solid gypsum dihydrate loading content is included in a reactor and heated to a temperature of about 270° F. to about 295° F. (equivalent to about 132° C. to about 146° C.), encompassing any value and subset therebetween. At least a portion of the first portion of gypsum dihydrate is calcined into calcium sulfate hemihydrate ("calcined gypsum") and nuclei are formed. The nucleation stage is maintained for a sufficient time to obtain desired nucleation, which may, in some examples, be in the range of about 1 minutes (min) to about 30 min, or preferably in the range of about 4 min to about 20 min, or more typically in the range of about 4 min to 10 min, encompassing any value and subset therebetween. In the second crystal growth stage, the second portion of solid gypsum dihydrate loading content is mixed with the first portion and exposed in a reactor vessel to a reduced temperature of about 210° F. to about 240° F. (about 99° C. to about 116° C.), encompassing any value and subset therebetween. The crystal growth stage is maintained for a sufficient time to obtain desired crystal growth and size, which may, in some examples, be in the range of about 1 min to about 120 min, or preferably about 5 min to about 60, or more typically about 10 min to about 30 min, encompassing any value and subset therebetween.

In another aspect of the present disclosure, the large, acicular calcined gypsum crystals obtained from the two-stage process described herein are used to make a gypsum board. In particular, the large, acicular calcined gypsum crystals obtained from the two-stage process described herein are mixed with host particles, such as a paper fiber, and the mixture discharged onto a flat, porous forming surface where a major portion of liquid (e.g., water) from the mixture is removed to form a filter cake. The filter cake is pressed into a board-shaped form and additional liquid is removed. The board-shaped form is then allowed to cool (by natural or artificial means) below the rehydration temperature to convert the calcined gypsum back into gypsum dihydrate. Any interlocking between the gypsum dihydrate and the host particles occurs during this rehydration stage, rather than during the two-stage calcination process. The board is then finally dried to remove substantially all remaining free liquid and stabilize the gypsum dihydrate and host particles in the form of a gypsum fiberboard (also known as gypsum and fiber composite board).

In an example, the present disclosure provides a method of making gypsum fiberboard including the following steps: mixing the calcined gypsum slurry with host particles to form a board mixture; depositing the board mixture on a flat, porous forming surface; dewatering at least a portion of liquid from the deposited board mixture to produce a filter cake; pressing the filter cake to remove additional liquid therefrom; rehydrating the filter cake to convert calcium sulfate hemihydrate into calcium sulfate dihydrate; and drying the filter cake to form gypsum fiberboard.

Advantages of the present invention may become apparent to those skilled in the art from a review of the following detailed description, taken in conjunction with the examples, and the appended claims. It should be noted, however, that while the invention is susceptible of examples in various forms, described hereinafter are specific examples of the invention with the understanding that the present disclosure is intended as illustrative, and is not intended to limit the invention to the specific examples described herein.

DETAILED DESCRIPTION OF THE INVENTION

Figure 1:
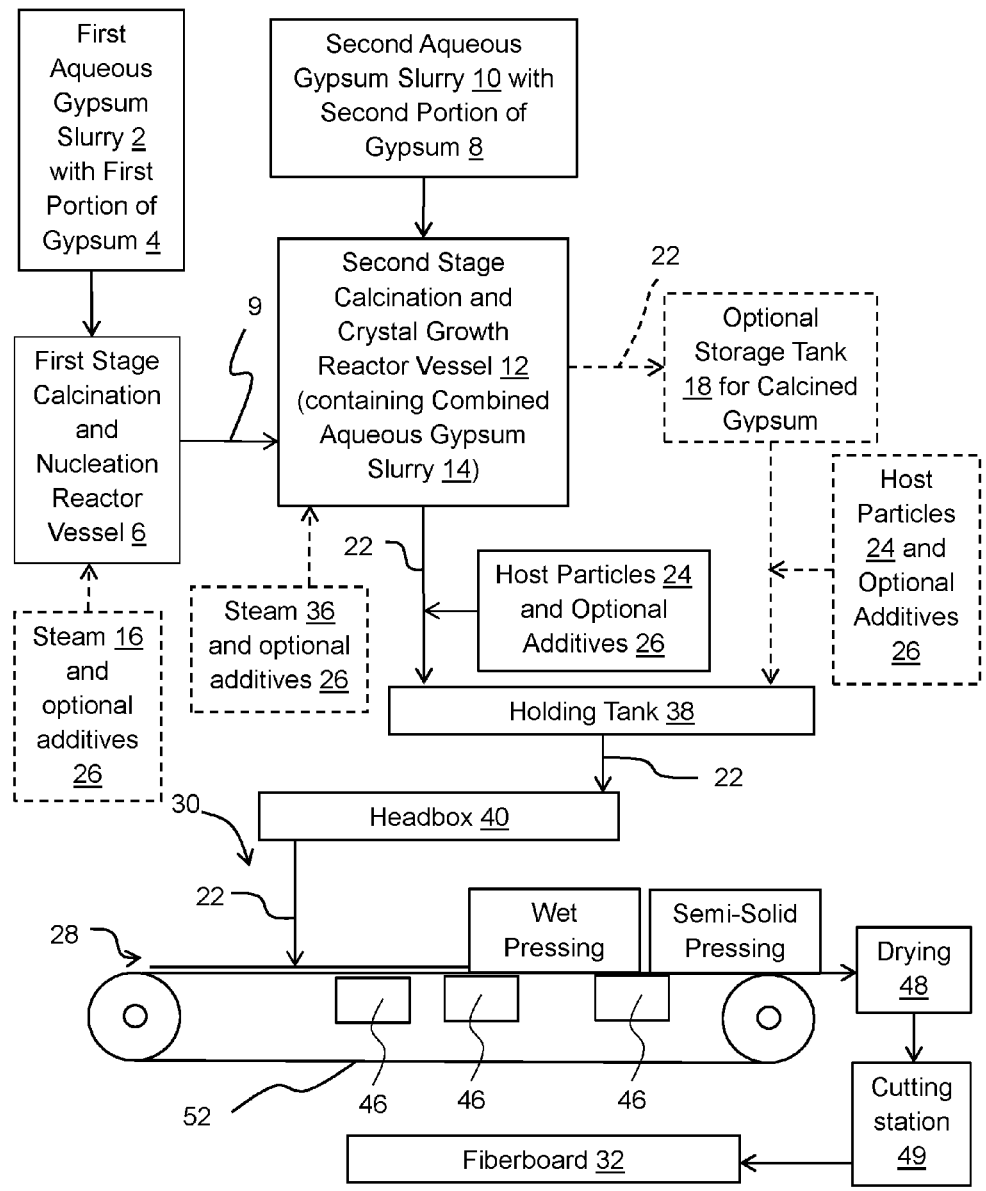
FIG. 1 illustrates is a flow chart showing an example of the two-stage calcination process of the present disclosure.

As used herein, the terms "gypsum" and "gypsum dihydrate," and grammatical variants thereof, refer to calcium sulfate in the stable dihydrate state (i.e., $CaSO_4.2H_2O$), including the naturally occurring mineral, the synthetically derived equivalents. The gypsum dihydrate material formed by the hydration of calcium sulfate hemihydrate (calcined gypsum) or anhydrite, and any mixture or combination thereof.

As used herein, the term "calcined gypsum," and grammatical variants thereof, refers to alpha calcium sulfate hemihydrate, water-soluble calcium sulfate anhydrite, and any mixture or combination thereof. The terms, "set gypsum" and "hydrated gypsum" are encompassed in the terms "gypsum" and "gypsum dihydrate." Aqueous contents (e.g., water) of a mixture can react spontaneously with calcined gypsum to form set gypsum.

As used herein, the term "acicular," and grammatical variants thereof, refers to a crystal morphology composed of slender, needle-like crystals.

As used herein, the term "host particle," and grammatical variants thereof, refers to any non-gypsum macroscopic particle of any shape, such as a fiber, a chip, or a flake. A host particle is generally insoluble in an aqueous slurry liquid comprising gypsum. In certain instances, a host particle may have accessible voids or other surface imperfections for interaction with calcined gypsum or rehydrated gypsum.

As used herein, the term "gypsum fiberboard," and grammatical variants thereof, refers to hardened mixtures of gypsum and host particles used to produce boards wherein at least a portion of the gypsum is in the form of acicular gypsum crystals formed by the hydration of acicular calcium sulfate hemihydrate crystals. The host particles may be mixed, interlocked, or otherwise distributed throughout the gypsum fiberboard with the acicular gypsum.

All percentages and ratios used herein are by weight unless otherwise indicated.

Gypsum Crystallization

The theoretical basis for the multi-stage (at least two-stage) calcination method of the present disclosure relates to the process of calcined gypsum crystallization. The driving force behind the conversion of gypsum dihydrate into calcined gypsum is supersaturation. When gypsum dihydrate is mixed with an aqueous fluid (e.g., water) to form a slurry, the aqueous fluid is saturated with calcium and sulfate ions and as the temperature is altered, the amount of such ions in the aqueous fluid changes according to the solubility of gypsum. Below the solubility point of gypsum, the slurry is undersaturated and crystallization is not possible. As the temperature surpasses the solubility point of gypsum, the slurry is initially in a metastable state, in which the slurry contains more dissolved solute than allowed under equilibrium conditions but crystallization can still not occur simultaneously. The metastable zone lies between undersaturation and supersaturation, in which the temperature is considerably above the solubility point of gypsum and the dissolved solute in the slurry is such that equilibrium conditions cannot be maintained and spontaneous crystallization is possible. The boundary between the metastable and supersaturation zone is the sinodal curve, representing the absolute limit of the metastable region where phase separation must occur immediately.

Nucleation is the first step of the crystallization process, in which a small number of ions, atoms, or molecules become arranged in a pattern characteristic of a crystalline solid. Nuclei form sites in which additional particles are deposited for crystal growth. Nucleation to begin the formation of crystal growth may be either homogeneous, without the influence of foreign particles (e.g., host particles), or heterogeneous, with the influence of foreign particles. Heterogeneous nucleation generally takes place more rapidly and easily because the foreign particles act as a scaffold for crystal growth, eliminating the need for incipient surface energy requirements. Accordingly, host particles and gypsum dihydrate are traditionally calcined simultaneously because the host particles are understood to be necessary to initiate nucleation.

However, significant production energy may be exhausted by subjecting both gypsum dihydrate and host particles simultaneously to calcination temperature. This would result in not only having to heat the gypsum dihydrate and its water carrier to calcination temperature but also having to heat the host particles and its water carrier to calcination temperature. The amount of additional water due to host particles is significant. For example, when the host particles are paper fibers, they may be prepared in a hydro-pulper at about 4% weight per weight (w/w) consistency at a temperature of about 120° F. to about 150° F. (about 49° C. to about 66° C.), encompassing any value and subset therebetween, and preferably about 140° F. (equivalent to about 60° C.). The paper fibers may then be mixed with gypsum dihydrate such that the total percentage of paper fibers is a target percentage, such as 5 wt. % of the gypsum dihydrate slurry. The amount of 4% pulp required to achieve this percentage, however, is very large because of the low consistency of the pulp. For example, for every 1 parts of pulp being added, 24 parts of water must be added. Accordingly, the amount of energy required to heat the pulp alone to calcination temperatures significantly above 200° F. (93° C.), such as above about 260° F. (127° C.), is substantial. The present invention solves this problem.

Nucleation may further be primary, occurring spontaneously from solution, or secondary, in which nucleation occurs by deposition of solute on an existing parent crystal. Secondary nucleation requires a lower activation energy compared to primary nucleation. Competing primary and secondary nucleation mechanisms often determine final crystal size distribution, which is characterized by crystal growth. Crystal growth is the second step of the crystallization process, in which new ions, atoms, or molecules string into a characteristic arrangement of a crystalline lattice and increase in size (e.g., length, width, height, and the like, and any combination thereof).

Nucleation and crystal growth are each functions of supersaturation. Without being bound by theory, at relatively low supersaturation, crystal growth dominates nucleation resulting in the formation of a larger crystal size distribution. In contrast, at relatively higher supersaturation, nucleation dominates crystal growth resulting in a relatively smaller crystal size distribution. Thus, at higher temperatures, such as those traditionally used during gypsum calcination processes, smaller crystal sizes are obtained because the level of supersaturation is higher at such temperatures. As a result, crystal modifiers which can increase the size of crystals, such as potash, are often needed.

Nucleation also traditionally dominates during a gypsum calcination process as the loading content of gypsum dihydrate is increased because the gypsum dihydrate acts as a surface for nucleation to occur, thereby resulting in smaller crystal sizes. Accordingly, because it is desirable to obtain large, acicular calcined gypsum crystal morphology, traditional gypsum dihydrate loading content has been minimized.

Indeed, experimental evidence determined by the inventors demonstrated that as gypsum dihydrate feeding stock loading was increased from 4.5 wt. % to 22.5 wt. % to 45 wt. %, the size of the observed crystals was significantly affected, such that at 45 wt. % loading the crystals were very fine and generally unusable to form gypsum fiberboard. Such tiny, fine crystals may slow drainage, slo1w machine speed, increase moisture content in gypsum board, increase kiln gas usage, increase additive usage (e.g., siloxane), result in hydraulic crushing, and the like. The present invention solves this problem.

Two-Stage Calcination Process

The two-stage calcination process of the present disclosure provides for the formation of desirable large, acicular calcined gypsum crystal morphology without the use of host particles during the calcination process and at high gypsum dihydrate loading content. The two-stage calcination process generally suppresses primary nucleation and promotes crystal growth.

Advantageously, the two-stage process of the present disclosure results in a preferred calcined gypsum material for use in making gypsum fiberboard, while achieving significant energy and cost savings compared to traditional calcination methods. The two-stage process may further result in improved machine operability, reduced machine downtime, increased machine speed, reduced machine maintenance, and savings in process chemicals.

Referring now to FIG. 1, illustrated is a flow chart showing an example of an apparatus for performing the two-stage calcination process of the present disclosure. A first aqueous gypsum slurry 2 comprising a first portion of solid uncalcined gypsum dihydrate 4 is prepared by mixing the first portion uncalcined gypsum 4 (which may itself be in the form of an aqueous slurry) with a first aqueous fluid. The first gypsum slurry 4 has a pH in the range of from about 5.5 to about 8. The first gypsum slurry 4 is fed into the first calcination and nucleation reactor vessel 6, where it is treated at a first elevated (high) temperature and pressure to calcine the gypsum and achieve desired crystal nucleation. Thus, the product of the first calcination stage 6 contains water, crystals of calcium sulfate hemihydrate, and any unreacted calcium sulfate dihydrate.

In a second stage, the calcine gypsum product slurry 9 of the first calcination stage is combined with a second aqueous gypsum slurry 10. The second gypsum slurry 10 comprises a second portion of uncalcined gypsum 8 (which itself may be in the form of an aqueous slurry) and a second aqueous fluid. The first gypsum slurry 10 has a pH in the range of from about 5.5 to about 8, preferably 6.5-7.5, more preferably 6.7-7.5. When the product 9 of the first stage reactor vessel 6 is combined with the second gypsum slurry 10, a combined aqueous gypsum slurry 14 is formed. The combined aqueous gypsum slurry 14 is treated in a second stage calcination and crystal growth reactor 12 at a second reduced temperature (relative to the conditions in the first stage 6) and pressure to achieve desired crystal growth and morphology and calcine gypsum.

A final added gypsum amount is a total weight of the first portion of gypsum 4 and the second portion of gypsum 8. A total feed weight is a total weight of the first portion of gypsum, the second portion of gypsum, the first aqueous fluid, and the second aqueous fluid, in other words the first aqueous slurry plus the second aqueous slurry. The final added gypsum amount is equal to no greater than about 50% of the total feed weight. The first portion of gypsum is about 10% to about 50% by weight of the final added gypsum amount.

In preferred examples, the final amount of solid gypsum dihydrate may be in the range of from about 40% to about 50% by weight of the total feed weight (not including the weight of fluid from condensation of steam), encompassing any value and subset therebetween. Accordingly, the final amount of gypsum dihydrate may be about 40%, about 41%, about 42%, about 43%, about 44%, about 45%, about 46%, about 47%, about 48%, about 49%, or about 50% by weight of the total feed weight, encompassing any value and subset therebetween. In certain, the final amount of gypsum dihydrate is about 45% by weight of the total feed weight.

Consistent with the present disclosure, any of the aqueous slurries described herein may include no additives or other solids intentionally included therein other than the solid gypsum dihydrate. However, additives, such as calcination enhancing agents or crystal modifiers, may be included, without departing from the scope of the present disclosure. The elimination or reduction of the use of additives further reduces costs associated with the two-stage calcination process.

Referring again to FIG. 1, the first portion of gypsum dihydrate 4 in the first stage 6 is a percentage of the final amount of gypsum dihydrate of the total feed weight. The first portion of gypsum dihydrate 4 may be at most about 50% by weight of the final amount of gypsum dihydrate. Typically, the first portion of gypsum dihydrate 4 is about 10% to about 50% by weight of the final amount of gypsum dihydrate, or more typically about 20% to about 40% by weight of the final amount of gypsum dihydrate of the total feed weight, encompassing any value and subset therebetween. Still more typically, the first portion of gypsum dihydrate 4 is about 20 to about 30% by weight of the final amount of gypsum dihydrate, encompassing any value and subset therebetween.

As stated above, the two-stage calcination process of the present disclosure does not require additives, although the inclusion of optional additives 26 does not depart from the scope of the present disclosure. However, preferably there is an absence of fibers during first stage and second stage calcination.

The first aqueous gypsum slurry 2 may be formed by mixing the first portion of the gypsum dihydrate 4 and the first aqueous fluid simultaneously, or in any order with the first portion of the gypsum dihydrate being added to the first aqueous fluid or vice versa, without departing from the scope of the present disclosure.

In the first stage calcination and nucleation reactor vessel 6 the first stage of the two-stage calcination process described herein is performed. Thus, in reactor vessel 6 the first gypsum slurry 2 is heated under pressure to a first elevated temperature to convert at least about 95% of the first portion of gypsum dihydrate 4 into calcined gypsum and initiate nucleation of at least a portion of the calcined gypsum. The first elevated temperature harnesses the supersaturation theory of nucleation to form acicular alpha calcined gypsum crystal nuclei. Heating may occur by any method known to those skilled in the art, without departing from the scope of the present disclosure. In some examples, as shown in phantom in FIG. 1, heating to the first elevated temperature is achieved using steam 16. The reactor vessel 6 may be equipped with a continuous stirring or mixing device to agitate the first gypsum slurry 2.

The first temperature within the interior of the first stage reactor vessel 6 housing the first gypsum slurry 2 for facilitating nucleation may be in the range of about 270° F. to about 295° F. (about 132° C. to about 146° C.), encompassing any value and subset therebetween. Accordingly, the first temperature may be about 272.5° F. (133.6° C.), about 275° F. (135° C.), about 277.5° F. (136.4° C.), about 280° F. (138° C.), about 282.5° F. (139.2° C.), about 285° F. (141° C.), about 287.5° F. (141.9° C.), about 290° F. (143° C.), about 292.5° F. (144.7° C.), or about 295° F. (146° C.), encompassing any value and subset therebetween. Typically in the invention, the first temperature is about 275° F. to about 285° F. (about 135 to about 141° C.), encompassing any value and subset therebetween.

The first stage of calcination and nucleation in first stage reactor vessel 6 is maintained at the first elevated temperature for a sufficient time to convert the first portion of gypsum dihydrate 4 into calcined gypsum and initiate nucleation of at least a portion of the calcined gypsum. The calcined gypsum from the first stage reactor vessel 6 has nucleated acicular crystals of a first size, which are smaller than the desired optimal size after processing by the second stage 12. In some examples, the first size is in the range of about 0.1 micrometers (μm) to about 10 μm in average length, encompassing any value and subset therebetween, wherein the crystals are longer than they are wide. Accordingly, the first size of the nucleated acicular crystals may be about 0.1 μm, about 1 μm, about 2 μm, about 3 μm, about 4 μm, about 5 μm, about 6 μm, about 7 μm, about 8 μm, about 9 μm, or about 10 μm in average length, encompassing any value and subset therebetween, wherein the crystals are longer than they are wide.

The combined gypsum slurry 14 (combined first and second stage components) comprises an aqueous fluid (e.g., fresh water). Typically, the combined gypsum slurry 14 has about 35% to about 50% solids, encompassing any value and subset therebetween. Preferably, the combined gypsum slurry 14 has about 35% to about 45% solids, encompassing any value and subset therebetween.

In some examples, when sufficient time has passed to convert at least a portion of the first portion of gypsum dihydrate 4 to calcined gypsum crystals having the first size, the pressure in the first stage reactor vessel 6 may be reduced or removed and the heating ceased prior to continuing with calcination and crystal growth in the second stage calcination and crystal growth reactor vessel 12.

With continued reference to FIG. 1, to begin the second stage of the two-stage calcination process, a second aqueous gypsum slurry 10 comprising a second portion of uncalcined gypsum dihydrate 8 and a second aqueous fluid is combined with, in any order, the product slurry 9 of the first gypsum slurry 2 after nucleation to obtain the combined gypsum slurry 14 in the second stage calcination and crystal growth reactor vessel 12. As stated above, the final amount of gypsum dihydrate may be at most about 50% by weight of the total feed weight (i.e., prior to calcination). The combined gypsum slurry 14 may be formed by mixing the product slurry 9 with the second gypsum slurry 10 in any order. However, the product slurry 9 is relatively hotter than the second gypsum slurry. Thus, generally the second gypsum slurry 10 is admixed to the product slurry 9 to avoid prematurely overcooling any portion of the product slurry 9.

The combined aqueous gypsum slurry 14 is pressurized and maintained at a second temperature by any method (e.g., removing steam, adding steam, adjusting gypsum concentration of the second slurry, as necessary) that is less than the first temperature to facilitate crystal growth of the nucleated calcined gypsum product 9 from the first stage 6. The second reduced temperature allows the second stage of the method in the second stage calcination and crystal growth reactor vessel 12 to realize crystal growth with significantly reduced energy requirements as compared to the first stage 6. The reduction in temperature is ideally rapid because the second slurry 10 is at a significantly lower temperature than the first stage product slurry 9. Thus, the mixing will cause the combined slurry to quickly have a lower temperature than that of the reactor product slurry 9. However, gradual temperature reduction may also be used, without departing from the scope of the present disclosure. Without being bound by theory, after enough nuclei have been initiated during the first stage in first stage reactor vessel 6, rapid reduction of the temperature in the second stage reactor vessel 12 will force the combined gypsum slurry 14 into the metastable zone such that crystal growth is maximized and additional primary nucleation is minimized. The order of the reduction of temperature and the formation of the combined gypsum slurry 14 may be simultaneous or in any order with either the second temperature reduction or the combined gypsum slurry 14 formation occurring first or second, without departing from the scope of the present disclosure. The second reduced temperature may be realized and maintained by any method known to those of skill in the art. Cooling, if desired, may be achieved by any method known to those of skill in the art, including natural cooling or, for example, cooling by virtue of inclusion of the second gypsum slurry 10. In some examples, the second temperature is realized and maintained by use of steam 36. Preferably, the second temperature is maintained merely by the temperature reduction realized by combining the second aqueous gypsum slurry 10 and the first stage product slurry 9 to form the combined aqueous gypsum slurry 14. By this combination no additional heating steam or only moderate steam 36 is required to maintain the second temperature, thus achieving additional energy savings. The second stage calcination and crystal growth reactor vessel 12 may additionally be equipped with a continuous stirring or mixing device to agitate the combined aqueous gypsum slurry 14.

The second temperature within the interior of the second reactor vessel 12 housing the combined gypsum slurry 14 for facilitating crystal growth may be in the range of about 210° F. to about 240° F. (equivalent to about 99° C. to about 116° C.), encompassing any value and subset therebetween. Accordingly, the second temperature may be about 210° F. (about 99° C.), about 213° F. (about 101° C.), about 216° F. (about 102° C.), about 219° F. (about 104° C.), about 221° F. (about 105° C.), about 224° F. (107° C.), about 227° F. (108° C.), or about 240° F. (116° C.), encompassing any value and subset therebetween. Typically in the invention, the second temperature is about 230° F. to about 240° F. (about 110 to about 116° C.), encompassing any value and subset therebetween.

With continued reference to FIG. 1, the second stage of crystal growth (which may include some minimal crystal nucleation) at the second temperature 20 is maintained in the second stage reactor vessel 12 for a sufficient time to facilitate crystal growth of the calcined gypsum, including the already nucleated crystals. In some examples, the second stage is maintained until at least a portion of the calcined gypsum forms large acicular alpha hemihydrate crystals having a second size that is larger than the first size of the nucleated crystals formed in the first stage 6. In some examples, the second size is in the range of about 25 μm to about 100 μm in average length, encompassing any value and subset therebetween. Accordingly, the second size of the acicular crystals may be about 25 μm, about 32.5 μm, about 40 μm, about 47.5 μm, about 55 μm, about 62.5 μm, about 70 μm, about 77.5 μm, about 85 μm, about 92.5 μm, or about 100 μm, encompassing any value and subset therebetween. Typically, a length to diameter aspect ratio of the second size crystals is in the range of about 10 to about 100, encompassing any value and subset therebetween.

The second stage reactor vessel 12 after calcination and crystal growth discharges a second stage reactor product slurry 22 (the "calcined gypsum product slurry") containing the calcined gypsum and water. The calcined gypsum product slurry 22 may flow to a holding tank 38 or an optional storage tank 18.

As provided above, both the first and second calcination stages in the two-stage calcination may be performed at relatively neutral pH. Neutral pH is the most comfortable pH for the manufacture of gypsum fiberboard. Acidic pH will retard the setting of calcined gypsum and has a negative effect on strength. Lower pH will also cause equipment corrosion. The pH of the first gypsum slurry 2, the second gypsum slurry 10, and the combined gypsum slurry 14 may be in the range of pH about 5.5 to about 8, encompassing any value and subset therebetween. Accordingly, the pH of the first, second, and combined gypsum slurries may be about 5.5, 6, 6.5, 7, 7.5, or 8, encompassing any value and subset therebetween. Preferably, the first, second, and combined gypsum slurries have a pH of about 6.7 to about 7.5, encompassing any value and subset therebetween.

FIG. 1 shows respective separate reactor vessels 6, 12 for the first stage and second stage of the two-stage calcination process described herein. This may be performed as a batch process, as shown, or a continuous process, without departing from the scope of the present disclosure. Use of separate reactors, as shown in FIG. 1, may for example, be particularly useful if a large batch of calcined gypsum having the acicular crystals made according to the two-stage process described herein is desired.

Additional reactor vessels (e.g., a third reactor) may be used as part of the second stage of the two-stage calcination process, without departing from the scope of the present disclosure. For example, the second and third reactor vessels could operate in parallel wherein the first reactor vessel discharges to the second and third reactor vessels. Or the second and third reactors could operate in series wherein the first reactor vessel discharges to the second reactor vessel and the second reactor vessel discharges to the third reactor vessel.

Use of a series of reactor vessels may maximize the benefits of the two-stage calcination process, which each employ vastly different temperature ranges and volumes of slurry. The quick quenching of nucleation by temperature reduction to the metastable zone to minimize further nucleation and maximize crystal growth in the second stage may be better realized using a series of reactor vessels. In other instances, however, the mere difference in temperature between the heated first aqueous gypsum slurry and the second portion of gypsum dihydrate (and if applicable the second aqueous gypsum slurry having the second portion of gypsum dihydrate and a second aqueous fluid) to form the combined gypsum slurry may be sufficient to achieve the desired rapid temperature reduction.

Additionally, the use of a series of reactor vessels may maximize the energy savings benefit of the two-stage calcination process described herein. For example, the first high temperature nucleation stage may be performed in a relatively small first reactor vessel and the second much reduced temperature crystal growth stage performed in at least a second reactor vessel that is relatively larger. As an illustration, the first reactor vessel may receive only about 25% of a desired overall gypsum dihydrate amount, such that the first reactor vessel may be 25% smaller than the at least second reactor vessel, or even smaller depending on volume. Accordingly, only the temperature of the smaller first reactor vessel receiving the reduced volume of feeding stock of gypsum dihydrate (and first aqueous fluid) would require high temperature heating, e.g., about 270° F. to about 295° F. (about 132° C. to about 146° C.), to nucleate calcined gypsum crystals. The temperatures required for the crystal growth stage in the larger, subsequent reactor vessel(s) is much reduced to a metastable zone temperature, e.g., about 210° F. to about 240° F. (about 99° C. to about 116° C.). Substantial energy savings could accordingly be realized, and the size of the crystals further adjusted by adjusting the concentration of feeding stock being sent to the small nucleation reactor vessel and the subsequent, larger crystal growth reactor vessel(s). Further, maintenance costs may be reduced by use of smaller reactor vessels.

In an alternative method, the first calcination stage 6 and the second calcination stage 12 may be performed in a single reactor vessel. That is, the first gypsum slurry 2 may be added or prepared in a reactor vessel, heated to the first elevated temperature and pressurized, the pressure and heat removed and the second gypsum slurry 10 added to the first calcination stage aqueous calcined gypsum product 9 in the reactor vessel to form the combined gypsum slurry 14, and then the combined gypsum slurry 14 is maintained at the second reduced temperature 20 and pressurized in the same reactor vessel.

Two-Stage Calcination Process and Gypsum Fiberboard

After completion of the two-stage calcination process, and with continued reference to FIG. 1, the calcined gypsum slurry product 22 is produced having crystals of a desirable morphology (i.e., acicular) and size, particularly for forming gypsum fiberboard. In some examples, as shown in phantom in FIG. 1, the calcined gypsum slurry product 22 may be stored in a storage tank or vessel 18 for later use at a temperature below the rehydration temperature, typically below about 210° F. (99° C.). In other examples, the calcined gypsum slurry product 22 is immediately used to form gypsum fiberboard 32.

Whether the calcined gypsum slurry product 22 is immediately processed to form gypsum fiberboard 32 or obtained from a storage tank 18 to form gypsum fiberboard 32, the calcined gypsum slurry product 22 is mixed with host materials 24 and optional additives 26 to provide additional strength and structure to the gypsum fiberboard 32. The host particles 24 are typically composed of cellulosic material.

Generally, host particles 24 are included in the calcined gypsum slurry product 22 in an amount of from about 5% to about 12% (8-12% is the preferred range and 8-10% is the more preferred range) weight per weight of the final amount of gypsum dihydrate 34, encompassing any value and subset therebetween. For example, the amount of host particles 24 mixed into the calcined gypsum slurry product 22 may be about 4% by weight per weight of the final amount of the gypsum dihydrate 34.

Optional additives 26 may be included in the calcined gypsum slurry product 22 formed from the two-stage calcination process described herein. Such additives 26 may include, for example, accelerators, retarders, crystal modifiers, weight reducing fillers, reinforcing materials, fire retardants, water repellants, fillers, aqueous foam, recalcination inhibitors, binders, adhesives (e.g., siloxane), secondary dispersing aids, leveling or non-leveling agents, thickeners, bactericides, fungicides, pH adjusters, colorants, and the like, and any combination thereof, to facilitate production of gypsum fiberboard 32.

The calcined gypsum slurry 22 and host particle 24 mixture, as well as any included additives 26 (referred to herein as a "board mixture", is transferred, or otherwise discharged, from a reactor vessel 12 or storage tank 18 into an optional holding tank 38. The holding tank 38 may be equipped with a mixer or agitator or an optional mixer may be used before or after transferring one or both of the calcined gypsum slurry product 22 and host particles 24 (with or without optional additives 26). Typically, the host particles 24 and any optional additives 26 are mixed with the calcined gypsum slurry product 22 at or before passing through the headbox 40, which distributes (or discharges) the calcined gypsum slurry product 22 and host particle 24 mixture (as well as any included additives 26) onto a flat, porous forming surface 28. The flat, porous forming surface 28, as shown, may be a traveling porous belt of a dewatering conveyor 52 (e.g., a Fourdrinier-type machine).

The board mixture is distributed onto the flat, porous forming surface 28 and is dewatered to form a filter cake by the water in the slurry passing through the flat, porous forming surface 28, which may be facilitated or otherwise aided by vacuum from vacuum stations 46. Dewatering is performed at a temperature that is above the temperature at which calcined gypsum will rehydrate into gypsum dihydrate.

As much of the water as possible is removed through pressing while the temperature of the board mixture is still relatively high above the rehydration temperature (the temperature of the mixture can be lower than the rehydration temperature at this stage; the speed of rehydration will be slow even though the temperature has dropped slightly below the rehydration temperature). During dewatering, a significant portion of the aqueous fluid and any additional liquid (collectively simply "liquid") is removed from the board mixture to form the filter cake. The filter cake is further pressed to remove additional water and form the filter cake into a board-shaped form (e.g., a thin, flat polygonal shape) of desired thickness or density. The pressing may be achieved, for example, as shown in FIG. 1, by first wet pressing 42 using suction rollers and then further pressing in a semi-solid pressing step 44. Typically, at least about 85% to about 95% by weight of the liquid in the filter cake is removed during dewatering and pressing.

The removal of liquid during dewatering and pressing additionally cools the filter cake now in board form. The board form filter cake is further allowed to cool for a sufficient time to achieve the conversion of the calcined gypsum into rehydrated gypsum dihydrate. In one example, no artificial cooling means are employed and cooling is generally less than about 30 minutes, depending on the composition of the filter cake (e.g., the presence of additives). Thereafter, the board form filter cake is dried to remove substantially all remaining liquid to stabilize the rehydrated gypsum dihydrate and host particles, thereby forming gypsum fiberboard 32. Generally, no more than about 2% by weight of liquid remains after drying. Drying may take place, for example, by sending the board form filter cake through a drying unit 48 (e.g., a kiln) at a preferred temperature low enough to avoid recalcining any gypsum dihydrate on the surface. Then the dried mat is cut at a cutting station 49 into boards. The final cut dried board is accordingly a dimensionally stable fiberboard 32 reinforced with host particles 24.

The following examples are presented to further illustrate some preferred examples of the invention and to compare them with conventional methods and compositions outside the scope of the invention. The invention is not limited by the following examples but rather is defined by the claims appended hereto.

EXAMPLES

In each example below, a 2 gallon CHEMINEER™ reactor was used to convert gypsum dihydrate into calcined gypsum and cause crystallization thereof. Synthetic gypsum was used in each example unless otherwise stated. Where host particles are used, the host particles were provided in the form of pulp of paper fiber made from corrugated box. The prescribed amount of one more or all of synthetic gypsum, water (aqueous fluid), paper fiber (host particles), and/or any additives were mixed well initially in a 5 gallon bucket to form a particular slurry mixture and then poured into the reactor. The reactor was then closed and agitation begun at 225 RPM. Steam was used for raising the temperature of a slurry mixture within the reactor, unless otherwise indicated, by indirect heating. Samples of the various slurry mixtures were collected from the discharge located at the bottom of the reactor for analysis (e.g., at various stages of calcination). Crystal morphology of calcined gypsum was evaluated using an optical microscope at 10× magnification. At the end of calcination, all materials in the reactor were discharged into a sample collection bucket having a lid and a pressure relief opening. After all materials were discharged from the reactor, the pressure valve on the reactor was opened to relieve all pressure. The reactor was then opened, cleaned, and used for subsequent experimentation, each described below.

Comparative Example 1

In this example, the ability to obtain large, acicular calcined gypsum crystal morphology at high loading concentrations of 45 wt. % was evaluated by use of a succinic acid crystal modifier using traditional single-stage calcination. Low dose succinic acid was previously determined to be a crystal modifier during calcination of gypsum dihydrate to increase the size of acicular calcined gypsum crystals; at relatively higher dosages, the crystals became cylindrical and block-shaped. Succinic acid was supplied by use of succinic anhydride. Succinic anhydride at calcination temperatures hydrolyzes to succinic acid and, thus, succinic anhydride can be used interchangeably with succinic acid for calcination applications.

In this example, 45 wt. % solid synthetic gypsum dihydrate was used as feeding stock in water, with increasing concentrations of succinic anhydride of 0.0025 wt. % of the synthetic gypsum dihydrate, 0.0083 wt. % of the synthetic gypsum dihydrate, and 0.017 wt. % of the synthetic gypsum. Single-stage calcination at each concentration was performed at 270-280° F. (equivalent to 132-138° C.) and a pressure of 40-50 PSI.

Figure 2:
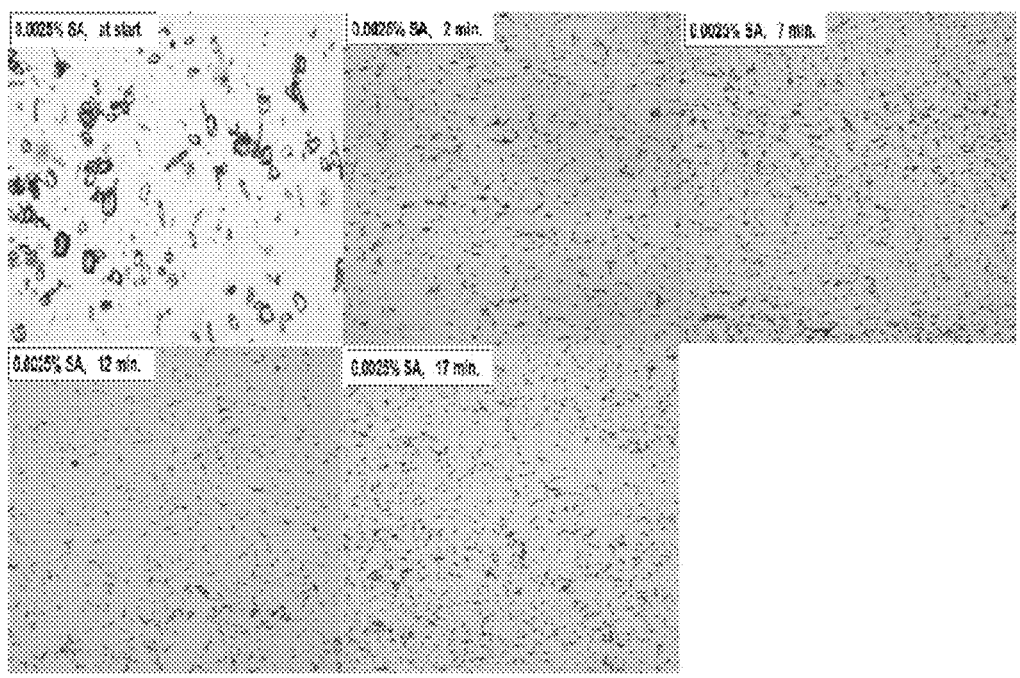
FIG. 2 illustrates the calcined gypsum crystal morphology of a slurry mixture of Comparative Example 1 comprising 45 wt. % synthetic gypsum dihydrate and 0.0025 wt. % succinic anhydride crystal modifier additive at various time points during traditional single-stage calcination.

FIG. 2 illustrates the calcined gypsum crystal morphology of a slurry mixture comprising 45 wt. % synthetic gypsum dihydrate loading concentration and 0.0025 wt. % succinic anhydride crystal modifier additive at various time points during calcination at 10X optical magnification. Samples were taken during calcination at time 0 min (at the start of calcination), time 2 min, time 7 min, time 12 min, and time 17 min. As can be seen in FIG. 2, at time 0 min, the start of calcination, the calcined gypsum crystals appear cylinder-shaped and relatively large. In less than 2 minutes (at time 2 min), the cylinder-shaped calcined gypsum crystals became very fine, needle-shaped (acicular) crystals. As time progressed from time 2 min to time 17 min, no significant increase in size of the calcined gypsum crystals was observed.

At 0.0025 wt. % succinic anhydride loading, it was hypothesized that a reason for the relatively larger crystal size at time 0 min compared to later time periods during calcination is that there were less seeding crystals, but an abundance of calcium and sulfate ions in the system for seeds to grow due to the high gypsum dihydrate loading content. Accordingly, the calcined gypsum crystals at time 0 were comparatively larger. As calcination progressed, more and more crystals were created (nucleated), and more and more of the synthetic gypsum dihydrate was consumed to supply calcium and sulfate ions for nucleation formation and crystal growth until all of the synthetic gypsum dihydrate was consumed. After this moment, calcium and sulfate ions on the surface of the larger cylinder-shaped crystals shown at time 0 min likely removed from the surface and were used for crystal growth of newly formed seeding crystals; the system will have an overall lowest energy when all crystals are of a similar size.

Figure 3:
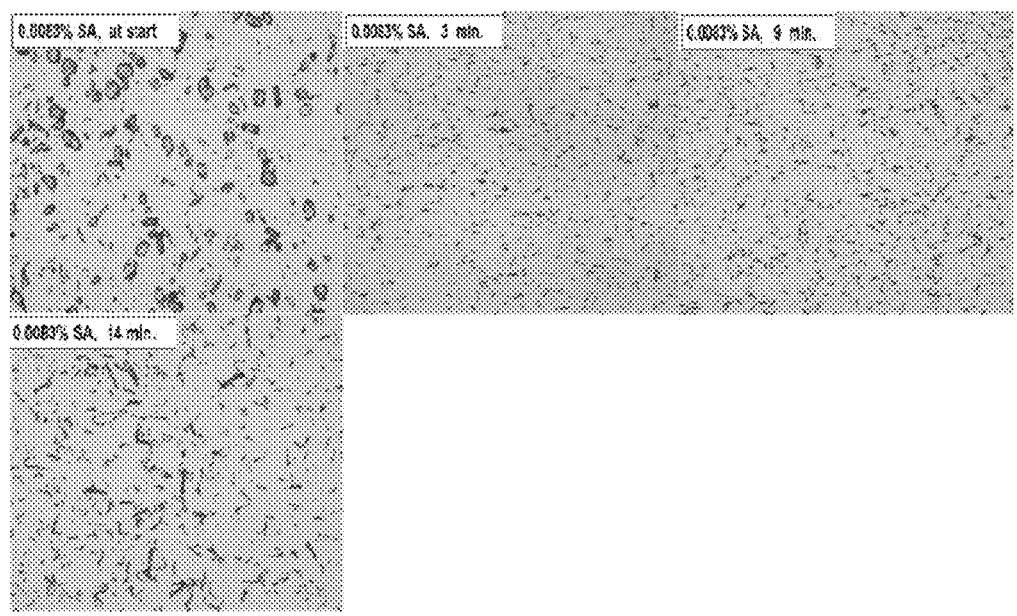
FIG. 3 illustrates the calcined gypsum crystal morphology of a slurry mixture of Comparative Example 1 comprising 45 wt. % synthetic gypsum dihydrate and 0.0083 wt. % succinic anhydride crystal modifier additive at various time points during traditional single-stage calcination.

FIG. 3 illustrates the calcined gypsum crystal morphology of a slurry mixture comprising 45 wt. % synthetic gypsum dihydrate loading concentration and 0.0083 wt. % succinic anhydride crystal modifier additive at various time points during calcination at 10× optical magnification. Samples were taken during calcination at time 0 min, time 3 min, time 9 min, and time 14 min. As shown in FIG. 3, at time 0 min, the start of calcination, the calcined gypsum crystals appear cylinder-shaped and relatively large, although slightly blockier in shape compared to the time 0 min crystals of FIG. 2 having a lesser concentration of succinic anhydride. However, again, as calcination time progressed, the crystals became fine, needle-shaped (acicular) crystals.

Figure 4:
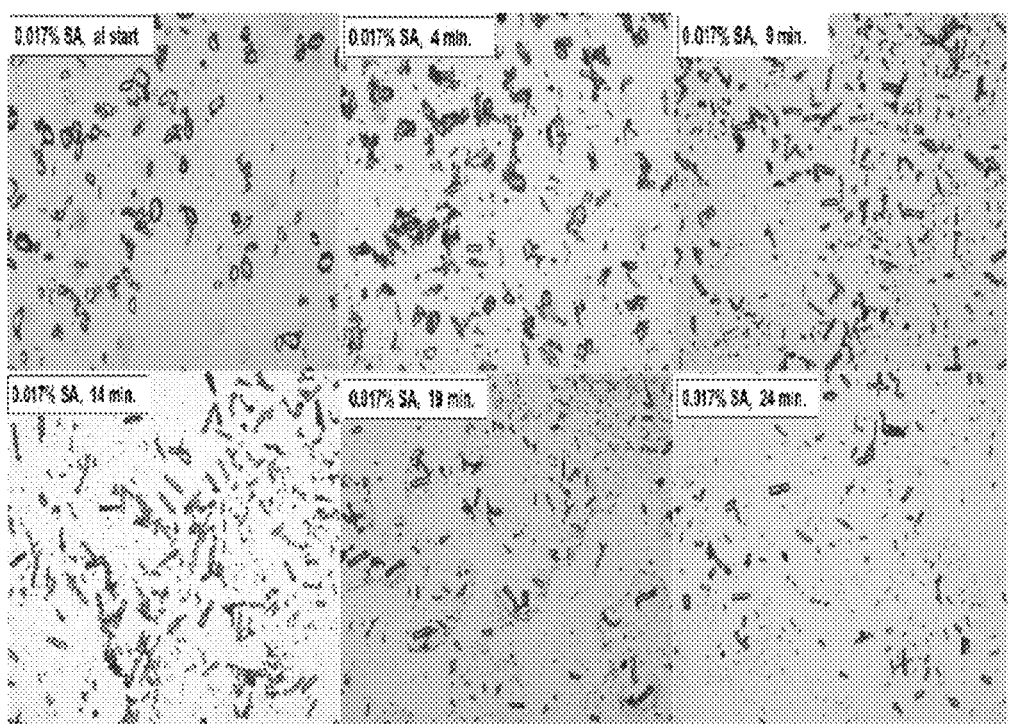
FIG. 4 illustrates the calcined gypsum crystal morphology of a slurry mixture of Comparative Example 1 comprising 45 wt. % synthetic gypsum dihydrate and 0.017 wt. % succinic anhydride crystal modifier additive at various time points during traditional single-stage calcination.

FIG. 4 illustrates the calcined gypsum crystal morphology of a slurry mixture comprising 45 wt. % synthetic gypsum dihydrate loading concentration and 0.017 wt. % succinic anhydride crystal modifier additive at various time points during calcination at 10× optical magnification. Samples were taken during calcination at time 0 min, time 4 min, time 9 min, time 14 min, time 19 min, and time 24 min. As shown in FIG. 4, the calcined gypsum crystals appear cylinder-shaped and blocky throughout the calcination process. No needle-shaped (acicular) crystals were observed.

Accordingly, the inclusion of succinic acid as a crystal growth modifier using traditional single-stage calcination at the desired high loading gypsum dihydrate of 45 wt. % was unable to achieve the desired large, acicular calcined gypsum crystal morphology described in the present disclosure.

Comparative Example 2

In this example, the ability to obtain large, acicular calcined gypsum crystal morphology at high loading concentrations of 45 wt. % was evaluated by use of a sodium chloride crystal modifier using traditional single-stage calcination. Unlike succinic acid, sodium chloride was believed to achieve needle-shaped (acicular) calcined gypsum crystals even at high dosage.

In this example, 45 wt. % solid synthetic gypsum dihydrate as used as feeding stock in water, with an increasing concentrations of sodium chloride of 0.83 wt. % of the synthetic gypsum dihydrate and 2.5 wt. % of the synthetic gypsum dihydrate. Single-stage calcination at each concentration was performed at temperature and pressure described in Example 1.

Figure 5:
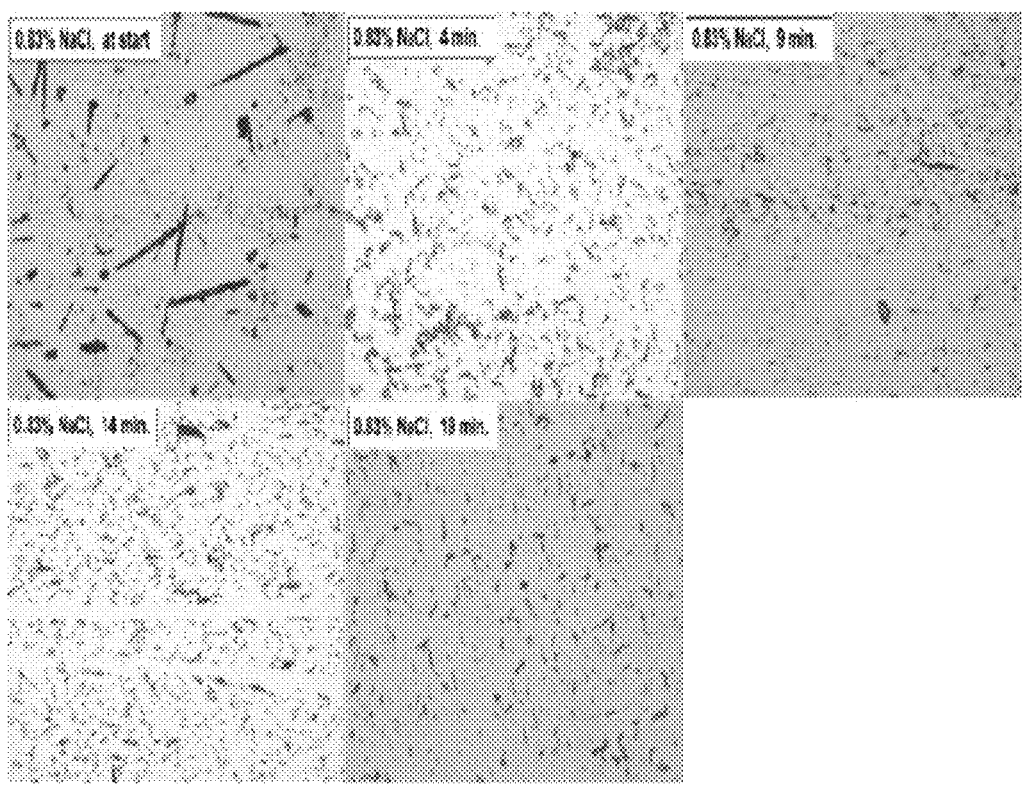
FIG. 5 shows photographs to illustrate the calcined gypsum crystal morphology of a slurry mixture of Comparative Example 2 comprising 45 wt. % synthetic gypsum dihydrate and 0.83 wt. % sodium chloride crystal modifier additive at various time points during traditional single-stage calcination.

FIG. 5 illustrates the calcined gypsum crystal morphology of a slurry mixture comprising 45 wt. % synthetic gypsum dihydrate loading concentration and 0.83 wt. % sodium chloride crystal modifier additive at various time points during calcination at 10X optical magnification. Samples were taken during calcination at time 0 min, time 4 min, time 9 min, time 14 min, and time 19 min. As can be seen in FIG. 5, at time 0 min, the start of calcination, large, needle-shaped (acicular) calcined gypsum dihydrate crystals were formed. As calcination time proceeded, the calcined gypsum crystals became smaller and finer.

Figure 6:
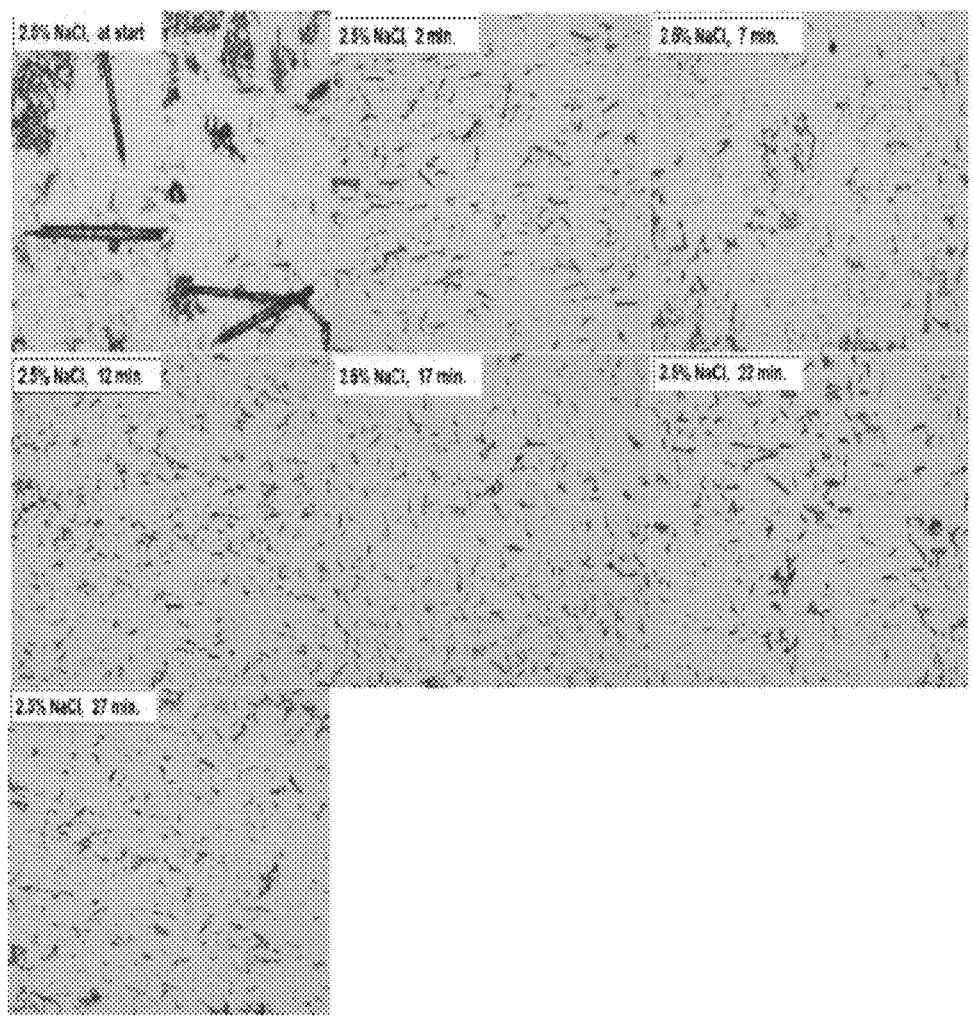
FIG. 6 shows photographs to illustrate the calcined gypsum crystal morphology of a slurry mixture of Comparative Example 2 comprising 45 wt. % synthetic gypsum dihydrate and 2.5 wt. % sodium chloride crystal modifier additive at various time points during traditional single-stage calcination.

FIG. 6 illustrates the calcined gypsum crystal morphology of a slurry mixture comprising 45 wt. % synthetic gypsum dihydrate loading concentration and 2.5 wt. % sodium chloride crystal modifier additive at various time points during calcination at 10X optical magnification. Samples were taken during calcination at time 0 min, time 2 min, time 7 min, time 12 min, time 17 min, time 22 min, and time 27 min. As shown in FIG. 6, even larger needle-shaped (acicular) calcined gypsum crystals were obtained at time 0 min, the start of calcination, compared to time 0 min of FIG. 5 having a lesser concentration of sodium chloride. However, again the calcined gypsum crystals rapidly decreased in size, and beginning at time 2 min and as calcination time proceeded, the calcined gypsum crystals became smaller and finer without substantial differences between morphology and size, even if slightly larger than those observed at the lower sodium chloride concentration.

Accordingly, the inclusion of sodium chloride as a crystal growth modifier using traditional single-stage calcination at the desired high loading gypsum dihydrate of 45 wt. % was unable to achieve the desired large, acicular calcined gypsum crystal morphology described in the present disclosure.

Comparative Example 3

In this example, the ability to obtain large, acicular calcined gypsum crystal morphology at high loading concentrations of 45 wt. % was evaluated by use of a combination of both succinic acid and sodium chloride crystal modifiers using traditional single-stage calcination.

In this example, 45 wt. % solid synthetic gypsum dihydrate as used as feeding stock in water, with a concentration of succinic anhydride of 0.017 wt. % of the synthetic gypsum dihydrate and a concentration of sodium chloride of 0.17 wt. % of the synthetic gypsum dihydrate. Single-stage calcination at each concentration was performed at temperature and pressure described in Example 1.

Figure 7:
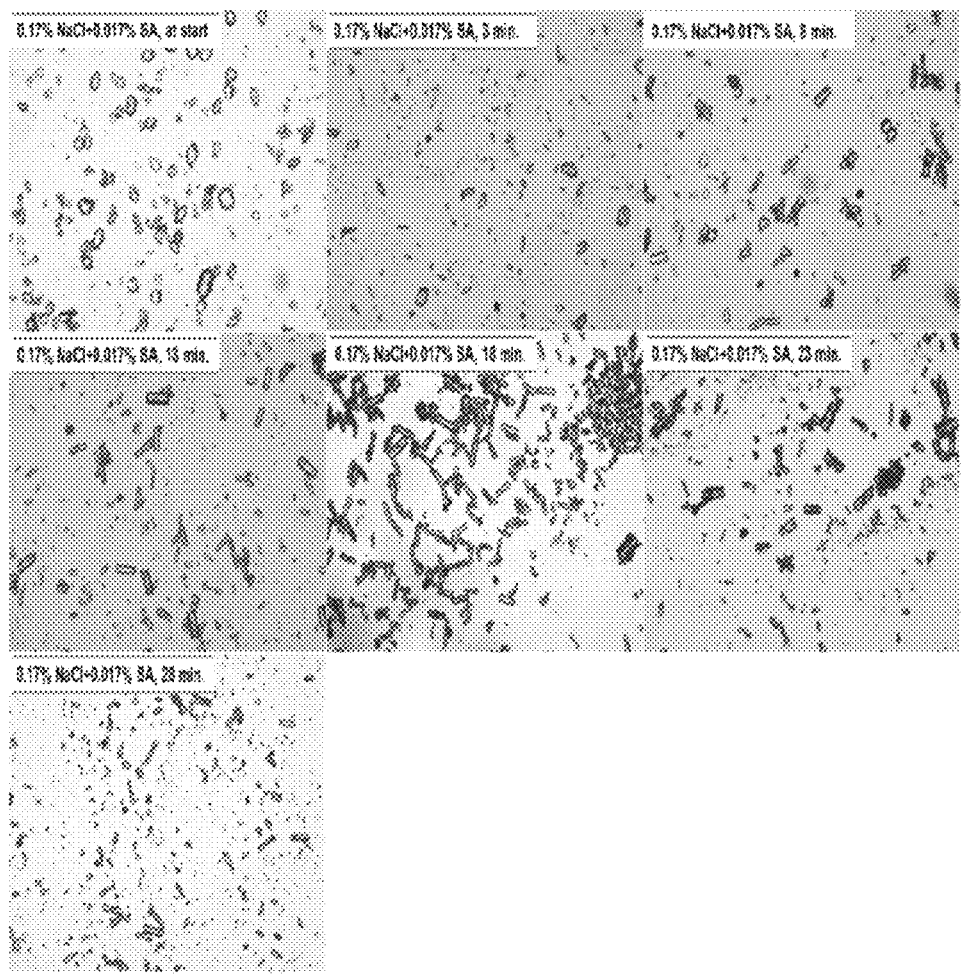
FIG. 7 shows photographs to illustrate the calcined gypsum crystal morphology of a slurry mixture of Comparative Example 3 comprising 45 wt. % synthetic gypsum dihydrate, with a concentration of succinic anhydride of 0.017 wt. % and of sodium chloride of 0.17 wt. % of the synthetic gypsum dihydrate crystal modifier additives at various time points during traditional single-stage calcination.

FIG. 7 illustrates the calcined gypsum crystal morphology of a slurry mixture comprising 45 wt. % synthetic gypsum dihydrate loading concentration, with a concentration of succinic anhydride of 0.017 wt. % of the synthetic gypsum dihydrate and a concentration of sodium chloride of 0.17 wt. % of the synthetic gypsum dihydrate crystal modifier additives at various time points during calcination at 10X optical magnification. Samples were taken during calcination at time 0 min, time 3 min, time 8 min, time 13 min, time 18 min, time 23 min, and time 28 min. As shown in FIG. 7, cylinder-shaped and blocky crystals appear throughout the entirety of the calcination process, similar to the shape obtained when only 0.017% succinic anhydride was used (FIG. 4).

Accordingly, the inclusion of the combination of succinic acid and sodium chloride as a crystal growth modifiers using traditional single-stage calcination at the desired high loading gypsum dihydrate of 45 wt. % was unable to achieve the desired large, acicular calcined gypsum crystal morphology described in the present disclosure.

Comparative Example 4

In this example, the ability to obtain large, acicular calcined gypsum crystal morphology at high loading concentrations of 45 wt. % was evaluated by use of a combination of both sodium chloride and tannic acid crystal modifiers using traditional single-stage calcination. Tannic acid was previously determined to be a potential crystal modifier.

In this example, 45 wt. % solid synthetic gypsum dihydrate as used as feeding stock in water, with a concentration of sodium chloride of 0.33 wt. % of the synthetic gypsum dihydrate and a concentration of tannic acid of 0.033% of the synthetic gypsum dihydrate. Single-stage calcination at each concentration was performed at a temperature and pressure described in Example 1.

Figure 8:
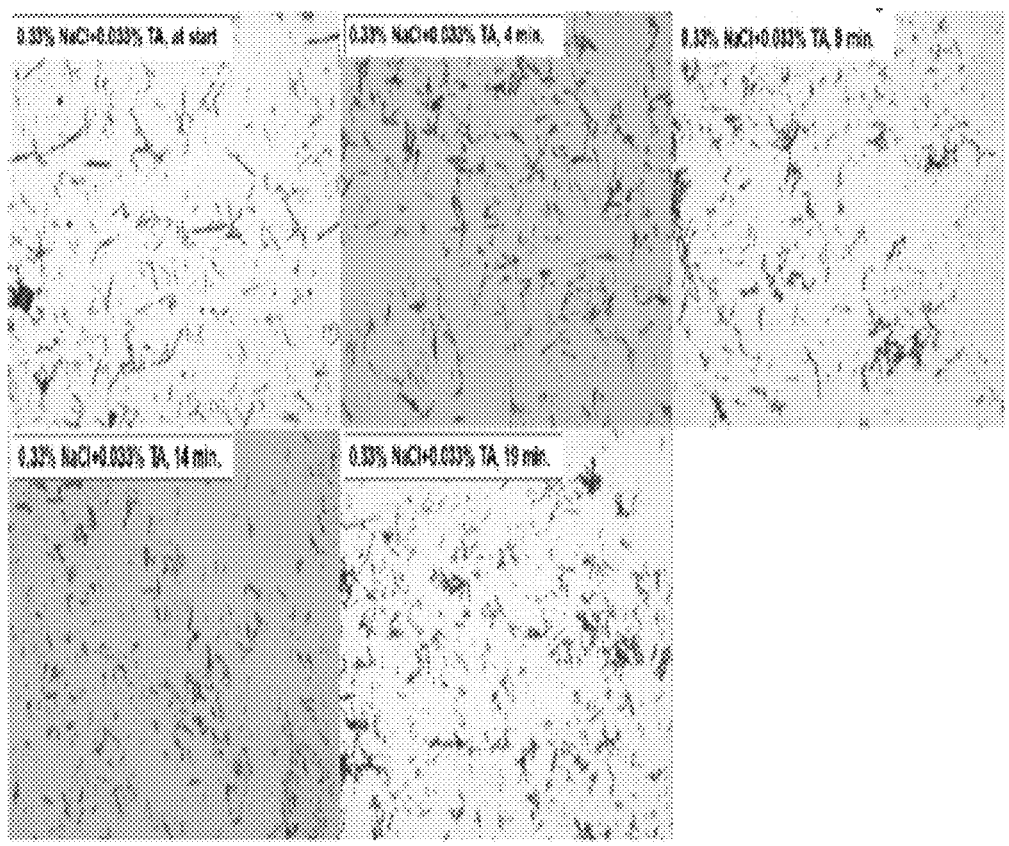
FIG. 8 shows photographs to illustrate the calcined gypsum crystal morphology of a slurry mixture of Comparative Example 4 comprising 45 wt. % synthetic gypsum dihydrate, with a concentration of sodium chloride of 0.33 wt. % and of tannic acid of 0.033 wt. % of the synthetic gypsum dihydrate crystal modifier additives at various time points during traditional single-stage calcination.

FIG. 8 illustrates the calcined gypsum crystal morphology of a slurry mixture comprising 45 wt. % synthetic gypsum dihydrate loading concentration, with a concentration of sodium chloride of 0.33 wt. % of the synthetic gypsum dihydrate and a concentration of tannic acid of 0.033 wt. % of the synthetic gypsum dihydrate crystal modifier additives at various time points during calcination at 10X optical magnification. Samples were taken during calcination at time 0 min, time 4 min, time 9 min, time 14 min, and time 19 min. As can be seen in FIG. 8, the calcined gypsum crystals obtained were tiny and fine throughout the entirety of the calcination process.

Accordingly, the inclusion of the combination of sodium chloride and tannic acid as a crystal growth modifiers using traditional single-stage calcination at the desired high loading gypsum dihydrate of 45 wt. % was unable to achieve the desired large, acicular calcined gypsum crystal morphology described in the present disclosure.

Example 5

Because even the use of crystal modifiers was unable to obtain the large, acicular calcined gypsum crystal morphology desired at the desired high loading content of gypsum dihydrate (see Comparative Examples 1-4 above), a two-stage calcination process was developed as described herein. In this example, the efficacy of the two-stage calcination process was evaluated in the absence of host fibers.

In this example, 45 wt. % total solid synthetic gypsum dihydrate concentration was used as feeding stock in water in the combined first and second stages. About one-fourth (equaling 22.5%) of the total gypsum dihydrate concentration was first included in the reactor for nucleation. The reactor was heated and pressurized as described in Example 1 to perform the first stage. After the first portion of the gypsum dihydrate was converted to calcined gypsum (after about 6 minutes), heating was ceased and the pressure inside the reactor quickly released. The remaining portion of the total gypsum dihydrate was included in the reactor. The temperature of the slurry inside was maintained at 230° F. (equivalent to 110° C.) using steam and pressurized to 16 psi to perform the second stage. The second crystal stage growth was maintained for about 25 minutes at the lower temperature (requiring less energy than the first stage at higher temperature).

Figure 9:
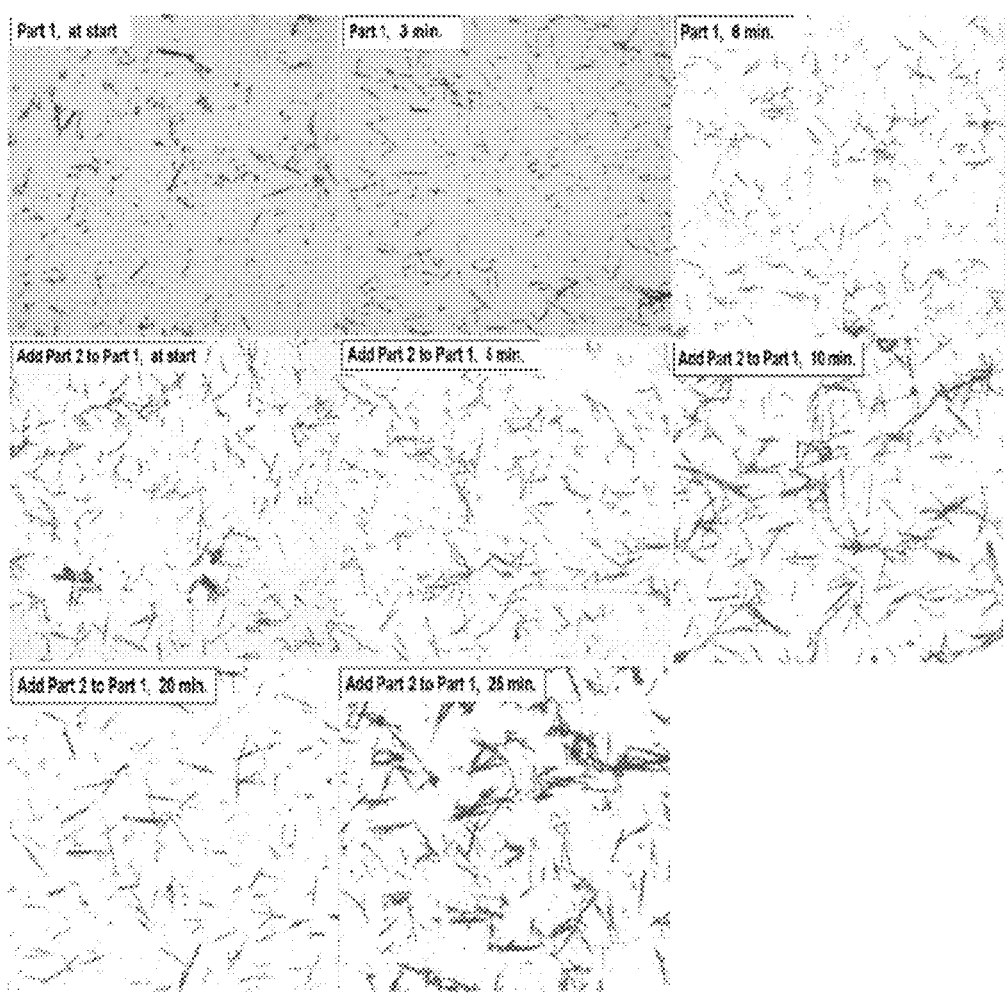
FIG. 9 shows photographs to illustrate the calcined gypsum crystal morphology of a slurry mixture of Example 5 comprising 45 wt. % synthetic gypsum dihydrate without host material according to an example of the two-stage calcination process of the present disclosure at various time points during calcination.

FIG. 9 illustrates the calcined gypsum crystal morphology of a slurry mixture comprising 45 wt. % synthetic gypsum dihydrate loading concentration without host material and using an example of the two-stage calcination process of the present disclosure at various time points during calcination at 10X optical magnification. Samples were taken during the first stage of calcination ("Part 1") at time 0 min (at the start of calcination, e.g., supersaturation), time 3 min, and time 6 min, and during the second stage of calcination ("Part 2") at time 0 min (at the start of inclusion of the final gypsum dihydrate concentration), at time 5 min, at time 10 min, at time 20 min, and at time 25 min. As can be seen in FIG. 9, during the first stage, Part 1 calcined gypsum crystals have nucleated and are small and fine. At the start of the second stage, Part 2 calcined gypsum crystals at the lower temperature begin to grow in size and exhibit the desired, needle-shaped (acicular) morphology. By Part 2, time 10 min, the idealized large, acicular calcined gypsum crystals described here were achieved and continued to grow as the second stage progressed.

Without being bound by theory, and as described above, the two-stage calcination process at least partially or wholly separates nucleation and crystal growth in two stages. In the first stage, only part of a total concentration of gypsum dihydrate is calcined to generate nucleation/seeding crystals at high temperature; in the second stage, the seeding crystals generated from the first stage are combined with the remaining total concentration of gypsum dihydrate at a lower temperature that is high enough for crystal growth but not nucleation (metastable zone).

Accordingly, this example demonstrated that the use of the two-stage calcination process described herein is able to achieve the desired large, acicular calcined gypsum crystal morphology at high loading gypsum dihydrate content (e.g., 45 wt. %), without the use of any host fibers. Further, since the temperature required in the second crystal growth stage to maintain the slurry in the metastable zone is significantly lower than the temperature required for the first nucleation stage, significant energy savings will result from use of the disclosed two-stage calcination process.

Comparative Example 6

In this example, a continuous, multi-reactor calcination process was evaluated without altering temperature and without adding a second gypsum slurry after nucleation. Thus, it differs from the two-stage process of the present disclosure.

In this example, an aqueous slurry comprising 45 wt. % gypsum dihydrate aqueous slurry, 4 wt. % paper fiber (host materials) aqueous slurry, resulting in about 30 wt. % solids (with about 95 wt. % being gypsum and about 5% being paper fiber) was continuously fed into a first reactor from a reactor feeding tank and steam was injected into the first reactor to heat the slurry to the calcination temperature and pressure as described in Example 1. The slurry in the first reactor was continuously transferred to a second reactor and then a third reactor. No additional slurry or steam was injected into the second reactor and third reactors, but the temperatures inside the three reactors were approximately identical. The average residence time of slurry in each reactor was approximately 6 to 8 minutes. After the third reactor, the slurry was sent to the product holding tank and thereafter made into gypsum board.

Because the temperatures in the three reactors were so close, both nucleation and crystal growth was able to occur in any/all reactors. Microscopic analysis of the slurry from each reactor showed that there was no significant difference in size and morphology of the calcined gypsum crystals in each of the different reactors, but the amount of uncalcined gypsum particles was significantly less in the second reactor than in the first reactor and there was almost no uncalcined gypsum in the third reactor. This example confirms both nucleation and crystal growth occurred in each of the reactors. It is further expected if the about 4 wt. % solid content paper fiber pulp is no longer co-mixed with the about 45 wt. % gypsum slurry (to result in a feeding stock solid content of about 28 wt. %) and the about 45 wt. % solid content gypsum slurry is used directly as feeding stock, the calcined gypsum crystals obtained in the rectors would be small and very fine as a result of the high consistency slurry.

Comparative Example 7

This example shows the relationship between size of the calcined gypsum (calcium sulfate hemihydrate) crystals and slurry concentration. A series of slurries were made from gypsum (calcium sulfate dihydrate) loaded at 4.5%, 9.0%, 15.8%, 22.5%, 45% wt. % and subjected to calcination conditions. Samples were taken during calcination at time 0 min, time 5 min, and time 10 min and photographed at 10X optical magnification.

Figure 10:
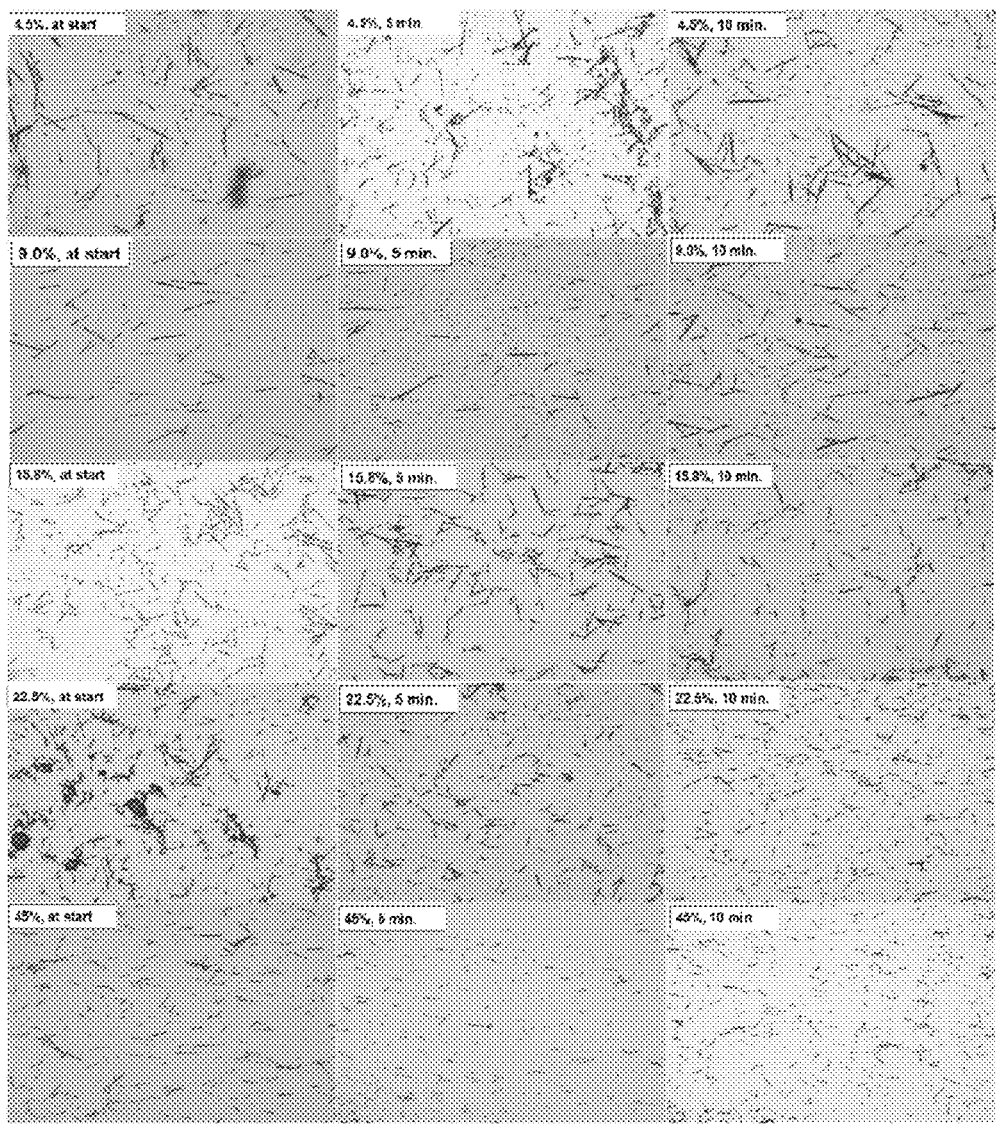
FIG. 10 shows photographs to illustrate the calcined gypsum crystal morphology of a slurry mixtures for Comparative Example 7 comprising 4.5%, 9.0%, 15.8%, 22.5%, 45% by wt. gypsum for slurry samples taken at times 0 minutes (at the start of calcination), 5 minutes, and 10 minutes.

FIG. 10 shows these photographs. As can be seen in FIG. 10, the size of the calcined gypsum crystals obtained got smaller with increased slurry concentration.

This shows a disadvantage of one stage calcination. Namely, small particle size results from high concentration. The present invention solves this problem.

What is claimed is:

1. A method comprising:
    performing a first calcination stage comprising heating a first gypsum slurry comprising a first portion of gypsum and a first aqueous fluid to a first temperature in a range of about 270° F. to about 295° F. and under pressure for a sufficient time to convert at least a portion of the first portion of gypsum to a first portion of calcium sulfate hemihydrate and nucleate at least a portion of the first portion of calcium sulfate hemihydrate to form nucleated acicular crystals of a first size, thereby producing a first calcination stage calcined gypsum product slurry having the nucleated acicular crystals of the first size;
    combining in any order a second portion of gypsum and a second aqueous fluid with the first calcination stage calcined gypsum product slurry to form a combined gypsum slurry; and
    performing a second calcination stage comprising maintaining the combined gypsum slurry under pressure at a second temperature in the range of about 210° F. to about 240° F. for a sufficient time to form acicular crystals of a second size greater than the first size, thereby forming a second stage calcined gypsum product slurry,
    wherein a final added gypsum amount is a total weight of the first portion of gypsum and the second portion of gypsum,
    wherein a total feed weight is a total weight of the first portion of gypsum, the second portion of gypsum, the first aqueous fluid, and the second aqueous fluid,
    wherein the final added gypsum amount is equal to at most about 50% of the total feed weight, and
    wherein the first portion of gypsum is about 10% to about 50% by weight of the final added gypsum amount.

2. The method of claim 1, wherein the first portion of gypsum is about 20% to about 30% by weight of the final added gypsum amount.

3. The method of claim 1, wherein the first size of the nucleated acicular crystals of the second stage calcined gypsum product slurry is in the range of about 0.1 micrometers to about 10 micrometers in average length.

4. The method of claim 1, wherein the final added gypsum amount is about 40% to about 50% by weight of the total feed weight.

5. The method of claim 1, wherein the second size of the large acicular crystals is in the range of about 25 micrometers to about 100 micrometers in average length.

6. The method of claim 1, wherein the pH of the first gypsum slurry and the pH of the combined gypsum slurry is in the range of about pH 5.5 to about pH 8.

7. The method of claim 1, wherein the first calcination stage is performed in a first reaction vessel and the second calcination stage is performed in at least a second reaction vessel.

8. The method of claim 1, further comprising:
    mixing the second stage calcined gypsum product slurry with host particles to form a board mixture;
    depositing the board mixture on a flat, porous forming surface;
    dewatering at least a portion of liquid from the deposited board mixture to produce a filter cake;
    pressing the filter cake to remove additional liquid therefrom;
    rehydrating the filter cake to convert calcium sulfate hemihydrate into calcium sulfate dihydrate; and
    drying the filter cake to form gypsum fiberboard.

9. The method of claim 8, wherein the host particles are mixed with the calcined gypsum slurry in the range of about 5% to about 12% weight per weight of the final added gypsum amount.

10. The method of claim 8, wherein the host particles are mixed with the calcined gypsum slurry in the range of about 8% to about 12% weight per weight of the final added gypsum amount.

11. The method of claim 8, wherein the host particles are mixed with the calcined gypsum slurry in the range of about 8% to about 10% weight per weight of the final added gypsum amount.

12. The method of claim 11, wherein the host particles are composed of a cellulosic material.

13. The method of claim 8, wherein the first portion of gypsum is about 20% to about 30% by weight of the final added gypsum amount.

14. The method of claim 8, wherein the first size of the nucleated acicular crystals of the second stage calcined gypsum product slurry is in the range of about 0.1 micrometers to about 10 micrometers in average length.

15. The method of claim 8, wherein the final added gypsum amount is about 40% to about 50% by weight of the total feed weight.

16. The method of claim 8, wherein the second size of the large acicular crystals is in the range of about 25 micrometers to about 100 micrometers in average length.

17. The method of claim 8, wherein the pH of the first gypsum slurry and the pH of the combined gypsum slurry is in the range of about pH 5.5 to about pH 8.

18. The method of claim 8, wherein the first calcination stage is performed in a first reaction vessel and the second calcination stage is performed in at least a second reaction vessel.

* * * * *